(12) United States Patent
Kim et al.

(10) Patent No.: US 8,130,541 B2
(45) Date of Patent: Mar. 6, 2012

(54) PHASE CHANGE MEMORY APPARATUS AND TEST CIRCUIT THEREFOR

(75) Inventors: Dong Keun Kim, Ichon-si (KR); Tae Hun Yoon, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 112 days.

(21) Appl. No.: 12/650,518

(22) Filed: Dec. 30, 2009

(65) Prior Publication Data

US 2010/0302841 A1  Dec. 2, 2010

(30) Foreign Application Priority Data

May 28, 2009  (KR) .................. 10-2009-0046806

(51) Int. Cl.
*G11C 11/00* (2006.01)

(52) U.S. Cl. .................. 365/163; 365/148; 365/201

(58) Field of Classification Search .................. 365/163, 365/189.14, 189.15, 189.16, 226, 201, 148
See application file for complete search history.

(56) References Cited

U.S. PATENT DOCUMENTS

| | | | |
|---|---|---|---|
| 6,940,777 B2* | 9/2005 | Ooishi | 365/226 |
| 7,573,758 B2 | 8/2009 | Park et al. | |
| 7,746,688 B2* | 6/2010 | Kim et al. | 365/163 |
| 2008/0068903 A1 | 3/2008 | Park et al. | |
| 2008/0144363 A1 | 6/2008 | Lee et al. | |
| 2009/0161416 A1 | 6/2009 | Lamorey et al. | |
| 2009/0175072 A1 | 7/2009 | Choi et al. | |
| 2010/0296349 A1* | 11/2010 | Yoon | 365/189.14 |

FOREIGN PATENT DOCUMENTS

| | | |
|---|---|---|
| JP | 2004-171730 | 6/2004 |
| KR | 100781550 B1 | 11/2007 |

* cited by examiner

*Primary Examiner* — Gene Auduong
(74) *Attorney, Agent, or Firm* — William Park & Associates Ltd.

(57) ABSTRACT

A test circuit transfers data, which is generated by current supplied from an external source, to a memory cell in response to a test mode signal.

12 Claims, 4 Drawing Sheets

PHASE CHANGE MEMORY APPARATUS AND TEST CIRCUIT THEREFOR

CROSS-REFERENCES TO RELATED APPLICATIONS

The present application claims priority under 35 U.S.C 119(a) to Korean Application No. 10-2009-0046806, filed on May 28, 2009, with the Korean Intellectual Property Office, which is incorporated herein by reference in its entirety as set forth in full.

BACKGROUND

1. Technical Field

The embodiments described herein relate semiconductor memory apparatuses, and more particularly, to a phase change memory apparatus and a test circuit therefor.

2. Related Art

There are various types of nonvolatile memories, including flash memories, phase change memories, and the like. Phase change memories, in particular, are designed to conduct write operations by varying the amount of write currents.

FIG. 1 is a schematic diagram of a general phase change memory apparatus.

As shown in FIG. 1, the phase change memory apparatus 10 is generally formed to include a plurality of unit cell arrays 110, an X-decoder 120, a Y-decoder 130, a block 140 including write drivers W/D and sense amplifiers S/A, a block 150 of global bit-line switches GYSW, blocks 160 of local bit-line switches LYSW, and blocks 170 of local word-line switches LXSW.

The operation of the phase change memory apparatus 10 will be explained in more detail in FIG. 2.

FIG. 2 is a block diagram illustrating a programming mechanism in a conventional phase change memory apparatus.

A current for a write operation is supplied to a sense-amp input/output line SIO from a write driver (W/D) 142. Global bit-line switches 150-1 and 150-2 are disposed between the sense-amp input-output line SIO and global bit lines GBL-1 and GBL-2. Each global bit line GBL is selected according to on/off states of the global bit line switches 150-1 and 150-2. These may comprise transmission gates each of which responds to a switch control signal gysw and an inverted switch control signal gyswB, the complementary signal of gysw, respectively. Reference numeral 144 denotes the sense amplifier S/A.

Data transferred to the sense-amp input/output line SIO from the write driver 142 is delivered to the local bit-line switch 160 through the global bit-line switches 150-1 and 150-2 and the global bit lines GBL-1 and GBL-2. Following the operation, the data is programmed into the memory cell selected by the word and bit lines.

It should be noted that a large amount of current and time is expended during this process of programming the phase change memory cells.

FIG. 3 shows the particular time and current expenditure through a program current profile of the general phase change memory cell.

Plot $P_{13}rs$ in FIG. 3 shows the amount of current and time expended when reset data is programmed into a selected memory cell. It should be noted that a large amount of current is applied to the memory cell in a relatively short time, a characteristic of reset data programming.

The process of programming set data, on the other hand, can be understood by the rectangular wave plot P_s1, or the slow quench wave plot P_s2.

According to FIG. 3, a large amount of current is required to program a phase change memory cell. The set data, in particular, requires a great amount of time in addition to a large amount of current.

Therefore, due to time and current constraints, programming a large number of phase change memory cells simultaneously (i.e., multi-cell programming) burdens the phase change memory apparatus with degradation of operation performance. Despite the efficiency of the multi-cell programming, the set data requires a programming time longer than 300 ns on average, due to limitations on current consumption in simultaneously programming multiple memory cells.

The number of memory cells simultaneously selectable from a memory bank in a write operation is dependent on the driving capacity of the write drivers W/D, the current supply capacity of the global bit-line switches 150, the local bit-line switches 160, and the local word-line switches 170. The transistors constituting the drivers and switches should be larger in size, but this may not be helpful to scaling down the phase change memory apparatus.

In a case, considering the capacitive limit of the write drivers W/D and the current supply burden of the switches, there is a programming mode of x8 or x16 in which data are programmed into one or two memory cells in each unit cell array. Accordingly, if data are to be programmed into 512M bit-memory cells in x16 mode in every unit cell array, it is necessary to execute 32M times of programming operations.

Because the production cost is increasingly dependent on the test time of the memory apparatus, there has been a great demand for shortening this particular test time.

SUMMARY

In one aspect of the invention, there is provided a test circuit of a phase change memory apparatus that transfers data, which is generated by a current supplied from an external current source, to a memory cell in response to a test mode signal.

In another aspect of the invention, there is provided A phase change memory apparatus which includes a memory bank having a plurality of unit cell arrays; and a test circuit configured to transfer data, which is generated by a current supplied from an external current source, to the memory bank in response to a test mode signal.

In another aspect of the invention, there is provided a phase change memory apparatus that includes a write driver configured to apply a program current to an input/output line; and a test circuit configured to apply data, which is generated by a current supplied from an external current source, to the input/output line in response to a test mode signal.

In another aspect of the invention, there is provided a memory apparatus that includes a cell mat; at least one local bit-line switch and at least one local word-line switch; at least one global bit line switch; at least one write driver for driving the at least one local bit lines; at least one sense-amp input/output line disposed between the at least one global bit line switch and the at least one write driver; at least one sense-amplifier; and at least one test circuit. The memory apparatus includes at least one test circuit. The memory apparatus is capable of operating in a test mode and in a normal write mode. The write driver provides a current to the at least one sense-amp input/output line when the memory apparatus operates in the normal write mode, and the at least one test circuit directly provides a current to the at least one sense-amp input/output line when the memory apparatus operates in the test mode.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

According to exemplary embodiments of the present invention, a current is directly supplied into a memory cell from an external source in a test mode of a nonvolatile memory apparatus such as a phase change memory apparatus which executes a programming operation by a current driving mechanism.

Generally, a current to a selected memory cell for a test operation is supplied through a write driver. In such case, however, the amount of current to the memory cell may be limited by the driving capacity of the write driver and the current supply capacity of switching elements passing the current from the write driver.

According to embodiments of the present invention, however, the current is directly supplied from an external source in the test mode. Therefore, a large amount of current can be supplied to the selected memory cell without being limited by the performance of the write driver and switching elements. Moreover, a plurality of memory cells can be programmed simultaneously, which greatly shortens the test time for memory cells in the phase change memory apparatus.

Hereinafter, embodiments of the present invention will be described in detail with reference to the accompanying drawings.

Figure 1:
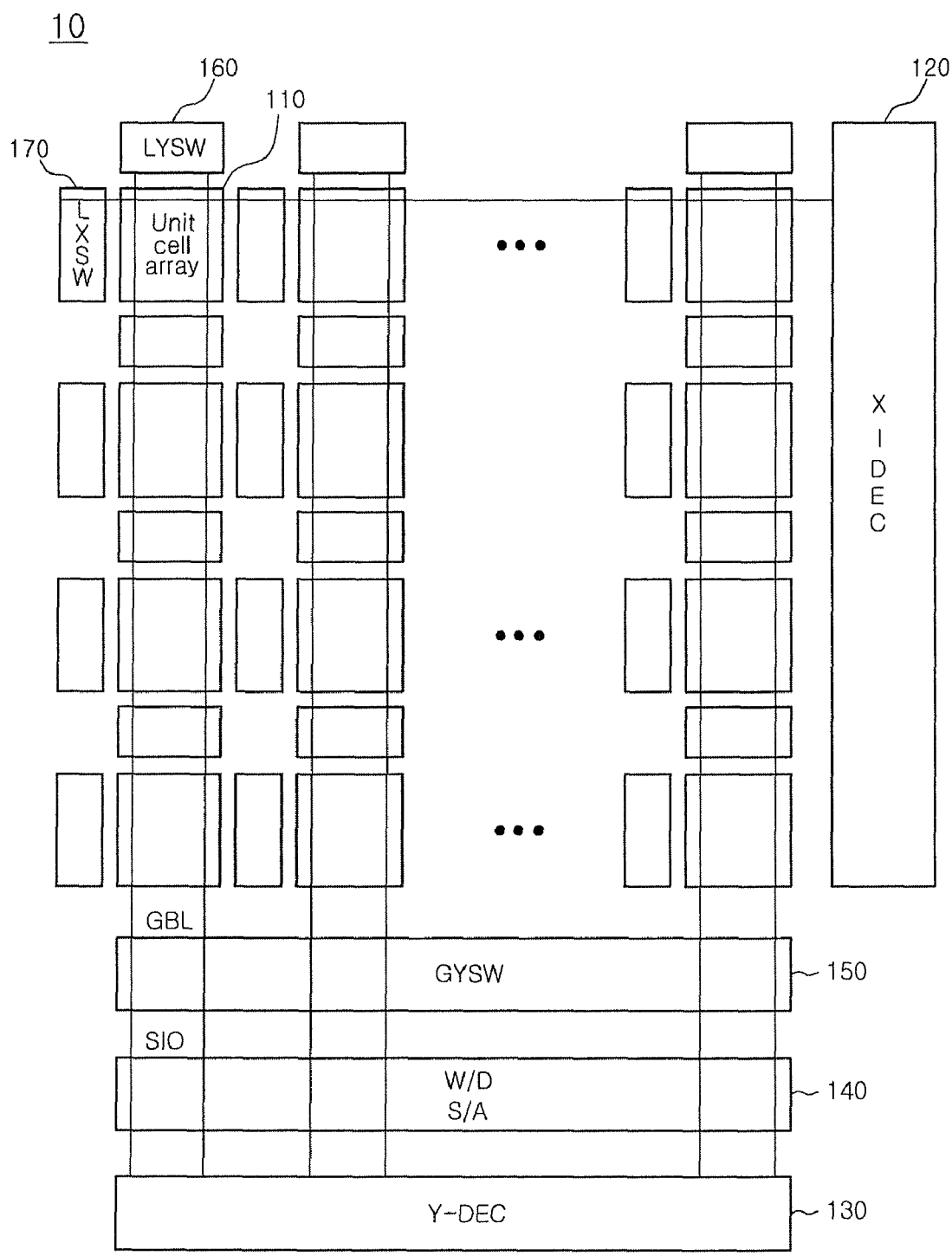
FIG. 1 is a block diagram schematically illustrating a conventional phase change memory apparatus.
Figure 2:
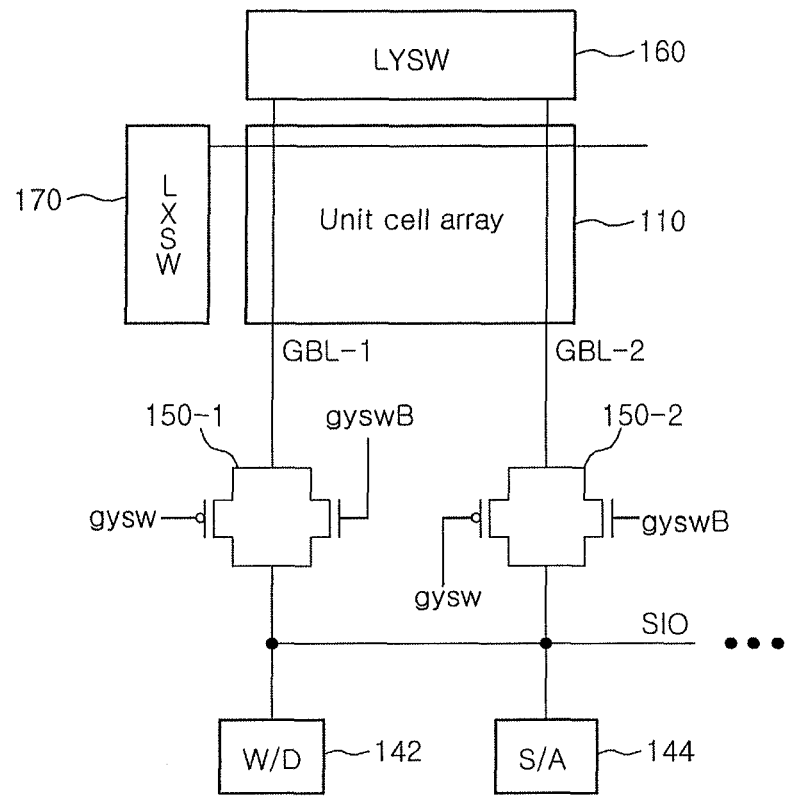
FIG. 2 is a block diagram illustrating a programming mechanism in a conventional phase change memory apparatus.
Figure 3:
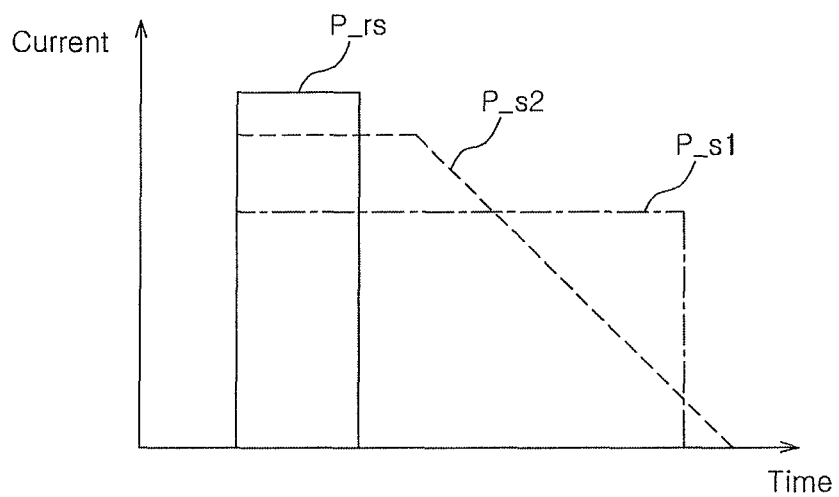
FIG. 3 is a plot showing a program current profile of a general phase change memory cell.
Figure 4:
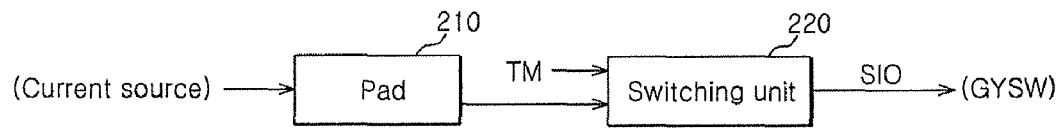
FIG. 4 is a block diagram illustrating a configuration of a test circuit according to an embodiment of the present invention.

FIG. 4 illustrates a schematic diagram of a test circuit in accordance with an embodiment of the present invention.

As illustrated in FIG. 4, the test circuit 20 is comprised of a pad 210 to which a current is applied from an external current source, and a switching unit 220. In response to a test mode signal TM, the switching unit 220 transfers data generated by the current supplied from the pad 210 through a sense-amp input/output line SIO to a global bit-line switch GYSW.

When the test mode signal TM is activated, the switching unit 220 is turned on. Then, the data generated by the current supplied to the pad 210 is transferred to the global bit-line switch GYSW through the switching block 220. Whether the global bit-line switch GYSW is turned on or off depends on the addresses which are inputted for test. Data transferred through the global bit-line switch GYSW is written into the memory cell designated by row and column addresses.

In this configuration, the test current is directly supplied from an external source to the global bit-line switches rather than passing through the write driver. Therefore, it is possible to provide a sufficient amount of current into a memory cell irrespective of the driving capability of the write driver.

Figure 5:
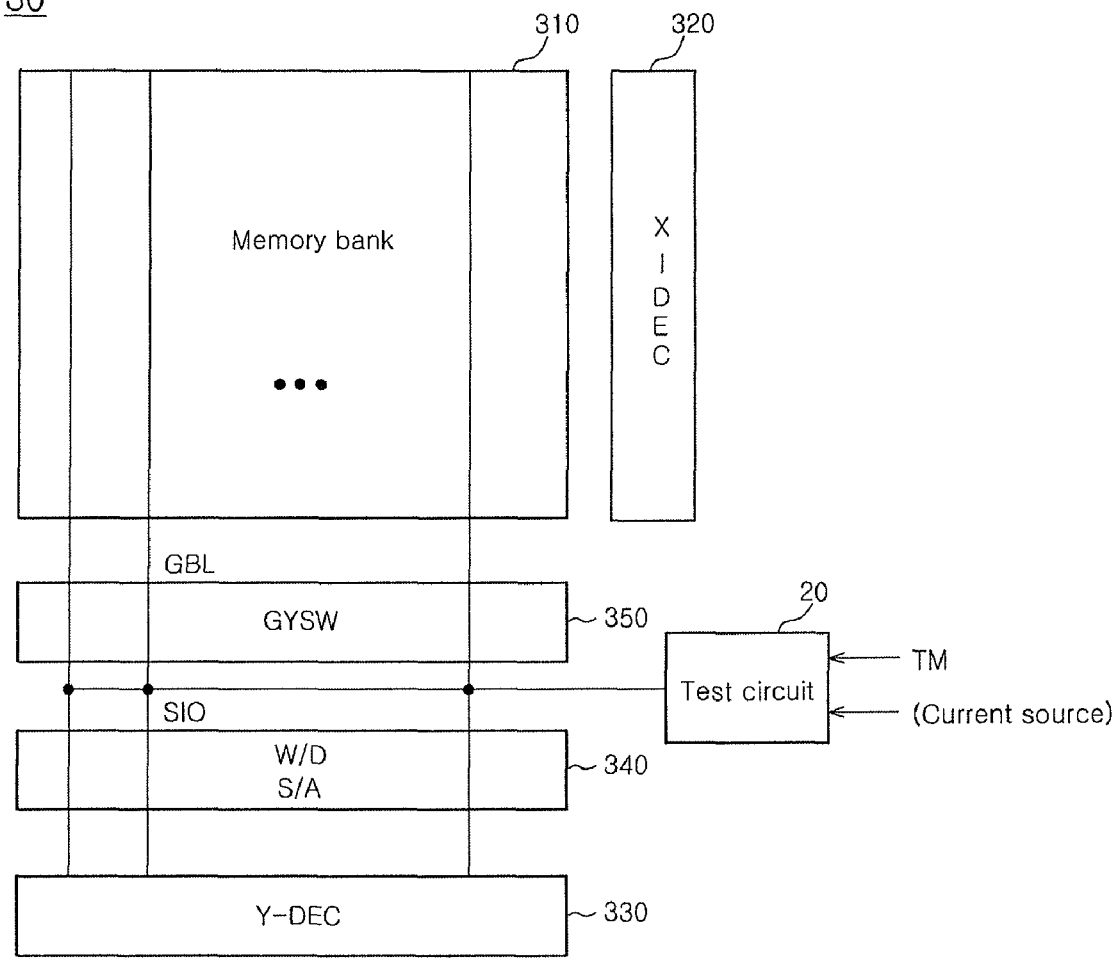
FIG. 5 is a block diagram illustrating a phase change memory apparatus with a configuration of the test circuit according to an embodiment of the present invention.

FIG. 5 is a block diagram illustrating a phase change memory apparatus having a test circuit in accordance with an embodiment of the present invention.

The phase change memory apparatus 30 shown in FIG. 5 includes a memory bank 310 having a plurality of unit memory cell arrays, an X-decoder (X-DEC) 320 generating a row address for accessing a memory cell of the memory bank 310, and a Y-decoder (Y-DEC) 330 generating a column address for accessing the memory cell of the memory bank 310. The apparatus 30 further includes a block 340 having write drivers W/D for driving bit lines selected by the Y-decoder 330, and sense amplifiers S/A for amplifying data of memory cells selected by the Y-decoder 330, a block 350 of the global bit-line switches GYSW selecting global bit lines in response to output signals of the Y-decoder 330, and the test circuit 20 providing the sense-amp input/output line SIO with data generated by the external current in response to the test mode signal TM.

Using the above-described configuration, an operation of the phase change memory apparatus 30 in the test mode will be described with reference to FIG. 6.

Figure 6:
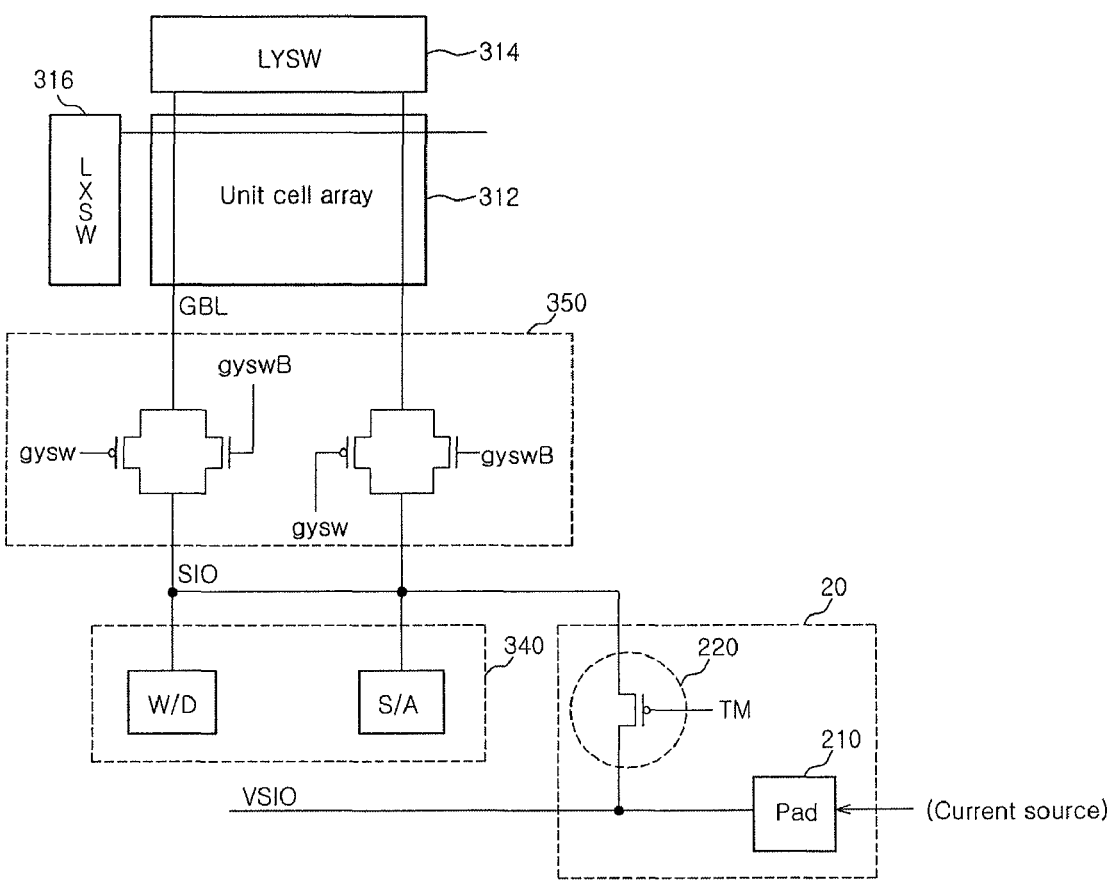
FIG. 6 is a block diagram illustrating a programming mechanism in the phase change memory apparatus according to an embodiment of the present invention.

In FIG. 6, each unit cell array 312 of the memory bank 310 is electrically connected to a local bit-line switch 314 and a local word-line switch 316.

In a normal programming operation, a write current is supplied into the sense-amp input/output line SIO from the write driver W/D. Data transferred to the sense-amp input/output line SIO is then programmed into a selected memory cell by the local bit-line and word-line switches 314 and 316 using a global bit-line switch 350 and a global bit line GBL.

The test circuit 20 includes the pad 210, which is disposed between the external current source and the sense-amp power supply line VSIO, and the switching unit 220, which is disposed between the sense-amp power supply line VSIO and the sense-amp input/output line SIO.

When the test mode signal TM is activated, data generated by the current supplied from the pad 210 is transferred to the sense-amp input/output line SIO through the switching unit 220. The data is then transferred by a test input address through one of the global bit line switches 350 to the global bit line GBL. Finally, the data is programmed into a memory cell selected by row and column addresses.

In the embodiments according to the present invention, a plurality of current terminal pads 210 may be present which may vary in number, depending on the capacity of the phase change memory apparatus.

Sometimes it may be necessary to adjust the number of word lines activated simultaneously. Consequently, the phase change memory apparatus may include a test mode controller (not shown) for controlling the X-decoder 320. For example, if the user wishes to reach an x32 mode, the test mode controller may control the X-decoder to enable each memory bank to select even or odd word lines; likewise, it can produce an x64 mode by selecting all of the word lines. Since each memory bank can be tested with either half (½) or all of its memory cells in a lump, it is possible to shorten the test time in the phase change memory apparatus.

Hence, by directly supplying currents (i.e., program currents) into memory cells from the external current source, it is possible to execute a programming operation for a plurality of memory cells (i.e., multi-cell programming) regardless of the driving capacity of the write drivers.

While certain embodiments have been described above, the embodiments described are by way of example only. Accordingly, the device and method described herein should not be limited based on the described embodiments. Rather, the devices and methods described herein should only be limited in light of the following claims when taken in conjunction with the above description and accompanying drawings.

What is claimed is:

1. A test circuit of a semiconductor memory apparatus that transfers data, which is generated by a current supplied from an external current source, to a memory cell in response to a test mode signal,
    wherein the test circuit comprising:
    at least one pad configured to receive the current from the external current source; and
    a switching unit configured to be electrically connected to the at least one pad for applying data, which is generated by the current supplied from the at least one pad, to an input/output line.

2. The test circuit of claim 1, wherein the input/output line is a sense-amp input/output line.

3. The test circuit of claim 1, wherein the pad is disposed between a sense-amp power supply line and the external current source.

4. A phase change memory apparatus, comprising:
    a memory bank having a plurality of unit cell arrays; and
    a test circuit configured to transfer data, which is generated by a current supplied from an external current source, to the memory bank in response to a test mode signal,
    wherein the test circuit comprises:
    at least one pad configured to receive the current from the external current source; and
    a switching unit configured to be electrically connected to the at least one pad for applying the data, which is generated by the current supplied from the pad, to an sense-amp input/output line in response to the test mode signal.

5. The phase change memory apparatus of claim 4, wherein at least one memory cell in the unit cell array is electrically connected to the sense-amp input/output line, wherein the test circuit applies the data, which is generated by the current supplied from the external current source, to the sense-amp input/output line.

6. The phase change memory apparatus of claim 4, wherein the pad is disposed between a sense-amp power supply line and the external current source.

7. The phase change memory apparatus of claim 4, further comprising:
    a decoder configured to designate even, odd, or the whole row addresses of the memory bank,
    wherein the test circuit transfers the data, which is generated by the current supplied from the external current source, to memory cells selected by the decoder.

8. A phase change memory apparatus, comprising:
    a write driver configured to apply a program current to an input/output line; and
    a test circuit configured to apply data, which is generated by a current supplied from an external current source, to the input/output line in response to a test mode signal,
    wherein the test circuit comprises:
    at least one pad configured to receive the current from the external current source; and
    a switching unit configured to be electrically connected to the pad for applying the data, which is generated by the current supplied from the pad, to an input/output line in response to the test mode signal.

9. The phase change memory apparatus of claim 8, wherein the input/output line is a sense-amp input/output line.

10. The phase change memory apparatus of claim 9, wherein the pad is disposed between a sense-amp power supply line and the external current source.

11. A memory apparatus, comprising:
    a cell mat;
    at least one local bit-line switch and at least one local word-line switch;
    at least one global bit line switch;
    at least one write driver for driving the at least one local bit lines;
    at least one sense-amp input/output line disposed between the at least one global bit line switch and the at least one write driver;
    at least one sense-amplifier; and
    at least one test circuit;
    wherein the memory apparatus includes at least one test circuit, the memory apparatus is capable of operating in a test mode and in a normal write mode, the write driver provides a current to the at least one sense-amp input/output line when the memory apparatus operates in the normal write mode, and the at least one test circuit directly provides a current to the at least one sense-amp input/output line when the memory apparatus operates in the test mode,
    wherein the at least one test circuit further comprises a pad configured to receive the current from the external current source; and a switching unit configured to be electrically connected to the pad for applying data, which is generated by the current supplied from the pad, to the at least one sense-amp input/output line.

12. The memory apparatus of claim 11, wherein the pad is disposed between a sense-amp power supply line and an external current source.

* * * * *